United States Patent [19]

Roberts

[11] Patent Number: 5,119,426
[45] Date of Patent: Jun. 2, 1992

[54] LINEAR ARRAY LEVEL METER DISPLAYING MULTIPLE AUDIO CHARACTERISTICS

[75] Inventor: John H. Roberts, Hickory, Miss.

[73] Assignee: Peavey Electronics Corporation, Meridian, Miss.

[21] Appl. No.: 536,410

[22] Filed: Jun. 7, 1990

[51] Int. Cl.$^5$ ............... H04R 29/00; G01R 11/63; G09G 3/20

[52] U.S. Cl. ................... 381/56; 324/103 P; 324/122; 324/96; 324/77 A; 340/753; 340/754; 340/782; 340/815.11

[58] Field of Search ............ 381/56; 324/103 P, 122, 324/96, 77 A; 340/753, 754, 782, 851.11

[56] References Cited

U.S. PATENT DOCUMENTS

| | | |
|---|---|---|
| 3,903,470 | 9/1975 | Mirabile ............... 324/103 P |
| 3,914,758 | 10/1975 | Ingle . |
| 3,952,247 | 4/1976 | Horichi . |
| 4,149,150 | 4/1979 | Miyakawa et al. . |
| 4,166,245 | 8/1979 | Roberts . |
| 4,213,125 | 7/1980 | Watanabe . |
| 4,243,985 | 1/1981 | Quayle . |
| 4,296,375 | 10/1981 | Takezaki . |
| 4,348,666 | 9/1982 | Ogita ............... 340/782 |
| 4,351,216 | 9/1982 | Hamm ............... 324/77 A |
| 4,480,221 | 10/1984 | Shozima . |
| 4,528,501 | 7/1985 | Dorrough et al. . |
| 4,532,472 | 7/1985 | Ishino . |
| 4,559,497 | 12/1985 | Farrugia . |

*Primary Examiner*—James L. Dwyer
*Assistant Examiner*—Jack Chiang

[57] ABSTRACT

A linear display device provides a floating bar type of display for instantaneous peak values and instantaneous average values of an audio signal. Pairs of respective peak and average comparators are coupled to a source of fixed value bias voltages. The comparators produce outputs when the peak value and the average value of the audio signal exceeds the bias voltage. A logic circuit connected to outputs of each pair of comparators provides an output only when the bias voltage exceeds the instantaneous peak value.

7 Claims, 2 Drawing Sheets

LINEAR ARRAY LEVEL METER DISPLAYING MULTIPLE AUDIO CHARACTERISTICS

BACKGROUND AND SUMMARY OF THE INVENTION

This invention is directed to a device which provides an illuminated, floating bar graph type display. The length of the illuminated bar as well as its floating or relative position are used to indicate plural or multiple characteristics of a complex electrical waveform. By "floating bar" is meant a group of illuminated segments in which both ends of the group may move, but not necessarily in unison. A "segment" as used herein is an art term meaning an individual light source, normally an LED (light emitting diode). The invention provides a rapidly and easily interpreted visual display of multiple electrical characteristics of a complex waveform.

The invention is particularly well suited for audio signal monitoring or analysis. In this sense it is related to my previous U.S. Pat. No. 4,166,245 of Sep. 28, 1979 which is incorporated herein by reference. The logic circuit means of the prior patent functions to illuminate a segment if the both the peak and RMS values exceed the bias values and when only the peak values exceed the bias values, to illuminate that single segment corresponding to the maximum value LED. The display, then, is difficult to read as to meaning because one must constantly keep in mind that whereas an LED may be illuminated because both the peak and RMS outputs exceed the bias voltages, another LED may not. As noted in that patent, the RMS or average value of the audio signal waveform provides knowledge of the loudness or apparent volume of an audio-derived input signal while the peak value of the waveform provides useful information vis-a-vis the maximum signal handling capability of the audio signal processing equipment or the saturation characteristics of the medium, a magnetic tape for example, on which the audio signal is being stored. In contrast to my prior patent, however, this invention discloses and claims wholly different logic means which functions to provide the illuminated, floating bar graph type display. In common with my prior patent, this invention utilizes sources of peak voltage and RMS voltage and a pair of comparators associated with each LED, and a bank of voltage-dividing resistors for providing the ascending scale of voltages represented by the individual LEDs.

As noted, the logic means of this invention functions to provide an illuminated, floating bar graph type display. The floating bar is an "open ended" bar of illuminated segments, in which the maximum value segment of the bar indicates peak voltage, the particular segment (not illuminated) next to the minimum value segment of the bar indicates RMS voltage. When using a logarithmic scale the number of segments of the bar is indicative of the crest factor (peak-to-average ratio). The illuminated segments therefore simultaneously display easily read and meaningful knowledge of three useful characteristics of an audio signal.

This invention relates to an electrical metering device of the linear type employing a floating bar of segments and logic means controlling the length and position of the bar within its possible upper and lower limits so that the upper limit extremity of the bar expresses knowledge of one electrical characteristic, the lower limit extremity of the bar expresses knowledge of another electrical characteristic, and the length of the bar between these limits expresses knowledge indicative of the ratio of these limits. The floating bar is preferably formed by a linear array of discrete and separated segments or indicators capable of illumination, preferably light emitting diodes (LEDs), depicting increasing electrical values from one end of the array to the other.

The invention is capable of simultaneously displaying three related electrical characteristics of an audio signal, namely the peak amplitude of the audio signal, the RMS or average value of the magnitude of the audio signal and the crest factor or peak-to-average ratio of the audio signal.

An object of the invention, therefore, is to provide a novel display for plural electrical characteristics of a complex waveform wherein the display involves a group of illuminated segments whose opposite ends are indicative of two different but related electrical characteristics of the same waveform and whose length is an indication of a third characteristic of that same waveform.

Basically, the invention involves a bank of first comparators and a bank of second comparators having first inputs connected to different voltage-divided fixed value inputs and with the first comparators having a second input all connected to a peak voltage value of the waveform and with the second comparators having a second input all connected to a RMS or average voltage value of the waveform. The first comparators have an output signal (a logical "one") only when the peak signal input to those comparators exceeds the bias voltage and this output signal is connected as one input to an output AND gate. The second comparators have an output signal (a logical "one") only when the RMS signal input to the those comparators exceeds the bias voltage and this output signal is connected to the other input of the output AND gate through an inverter. The output AND gates drive the separate LEDs. A particular output AND gate will not provide a "one" output and thus energize its associated LED unless its associated output inverter also provides a "one" output. Stated otherwise, a particular output AND gate will cause illumination of its associated LED if the comparator connected as one input to the associated output AND gate has a "one" output and the comparator connected through the associated inverter as the other input to the associated inverter as the other input to the associated output AND gate does not have a "one" output. Thus, a particular LED will be illuminated if and only if the peak value exceeds the voltage-divided bias corresponding to that particular LED but the average value does not exceed that of the same voltage-divided bias.

Thus, the invention is characterized by the illumination of LEDs of a linear array thereof as a function of exceeding the peak value and not illuminating them as a function of not exceeding the average value. The result is an illuminated, floating bar graph type display wherein the floating bar represents, at its top LED, the peak value of the waveform and wherein that unlit LED below this bar represents the average value of the waveform. As the values of peak amplitude and average amplitude vary, the bar graph will move or float as the LEDs forming the illuminated segments likewise move and the length of the floating bar may also vary. Regardless of the fineness or coarseness of uniform voltage divisions, the length of the floating bar will always give an indication of the crest factor (peak-to-average ratio)

for the waveform. Although there will be no exact correlation under those circumstances between the number of illuminated segment and the crest factor, a better correlation can be achieved by making the scale of the voltage-divided bias voltages logarithmic. Under these conditions, the number of illuminated segments will indicate the crest factor. Accordingly, the three characteristics of peak value, average value and crest factor are simultaneously displayed with this invention.

Other objects and advantages of this invention will become apparent as this description proceeds.

DETAILED DESCRIPTION OF THE INVENTION

Figure 1:
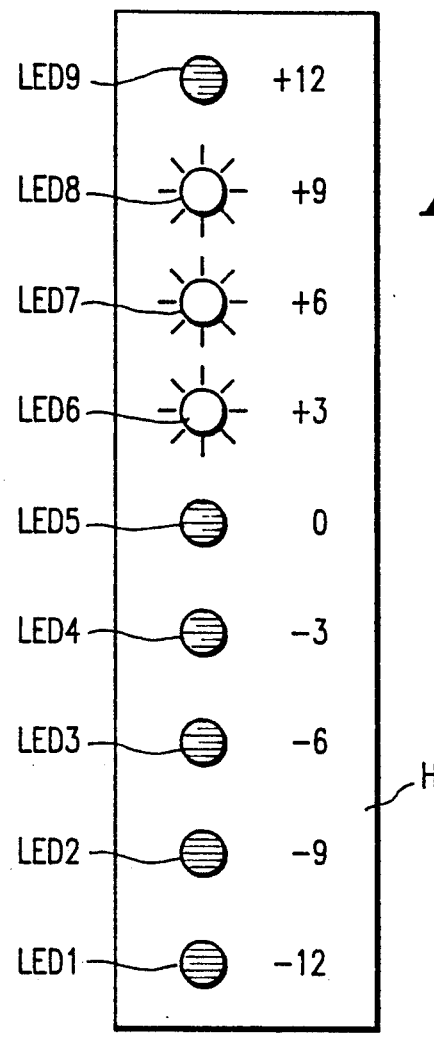
FIG. 1 is a diagrammatic view illustrating the principles of this invention.

Referring first to FIG. 1 which illustrates a housing H containing the electrical components of the invention, three LEDs LED6, LED7, and LED8 are indicated as energized whereas the rest of them are not. This is a purely arbitrary illustration for the purpose of description. The linear array of energized LEDs indicate that the peak voltage of the complex waveform being measured has a value as indicated for the LED8 and that the average voltage. value for the waveform is that indicated for the LED5. An important advantage of this type of display is that it very clearly indicates the amount of and degree to which the peak voltage exceeds the average voltage. That is, the crest factor is indicated and by making the scale of the illustrated voltage divisions logarithmic, the crest factor is directly related to the number of LEDs which are energized in the array. No interpolation is necessary and this advantage alone is very useful for one using the device.

Figure 2:
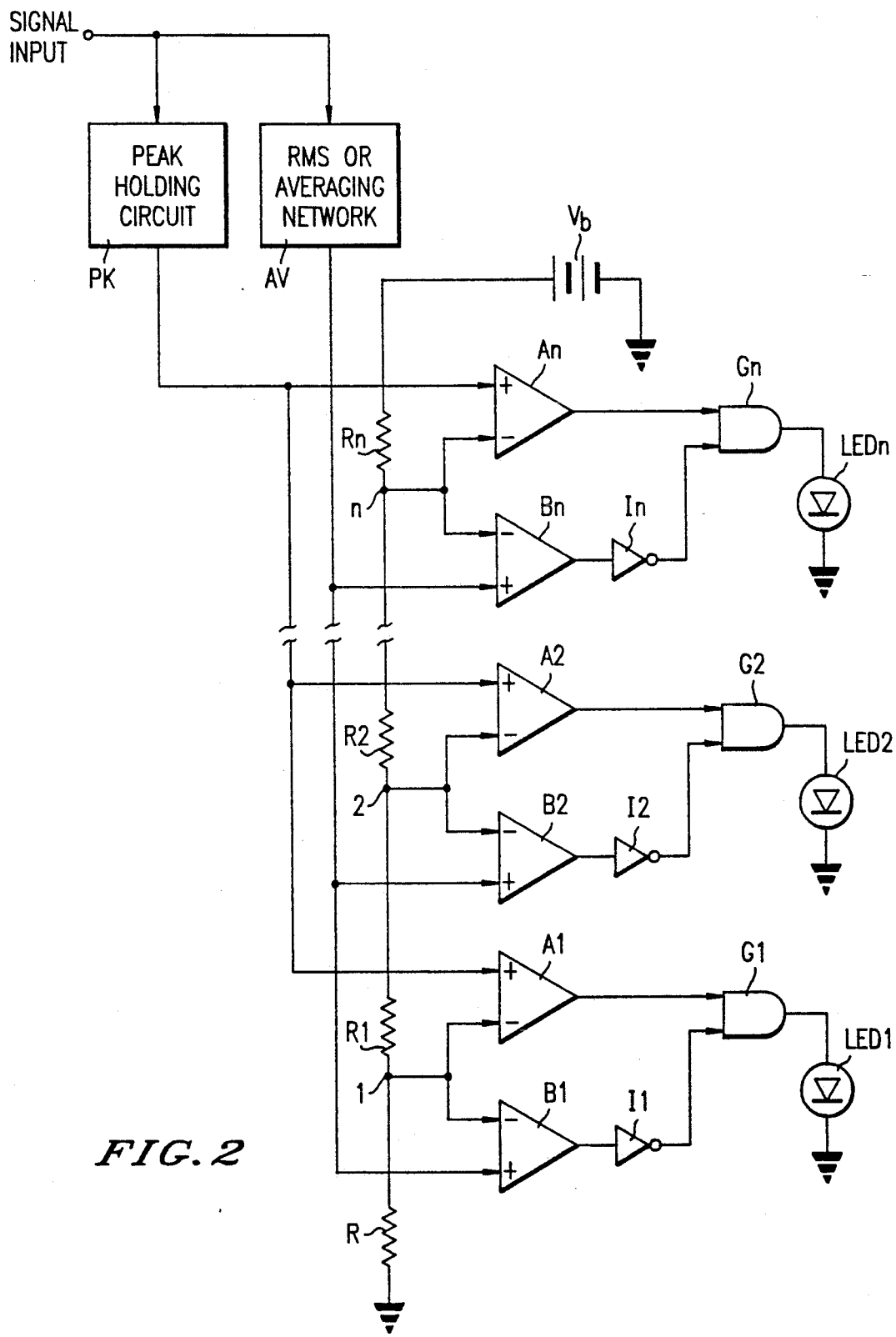
FIG. 2 is a circuit diagram illustrating the invention.

As shown in FIG. 2, there is a bank of voltage-dividing resistors R, R1, R2, ... Rn disposed between a bias voltage source Vb and ground, and a bank of pairs of respective peak and average comparators A1, B1; A2, B2; ... An, Bn in which every one of the comparators has its minus ($-$) input connected to a respective one of fixed-value voltage division junction points 1, 2, ... n. The plus ($+$) inputs of all the peak comparators A1, A2, ... An are connected to a suitable circuit which provides a source PK of a voltage corresponding to the peak voltage value of the audio signal, it being understood that this peak voltage value signal will be updated very often (e.g., at every positive and negative peak), as is the custom with such contemporary circuits. On the other hand, the plus ($+$) inputs of all the RMS comparators B1, B2, Bn are connected to a suitable circuit which provides a source AV of a voltage corresponding to the average or RMS value of the audio signal, it being understood that this RMS value will be updated at an appropriate rate as is the case for the peak value signals.

The output of each peak comparator A1, ... An is connected as one input to an output AND gate G1, G2, ... Gn and the output of each RMS comparators B1, B2, ... Bn is connected to respective inverter I1, I2, ... In and then as the other input to a respective output AND gate G1, G2, ... Gn. The logic circuit in each case comprises simply an AND gate and an inverter, and the logic performed is to provide a logical "one" output from each output AND gate if and only if the input to the associated peak comparators is a logical "one" and the input to the associated RMS comparator is a logical "zero".

Each output AND gate has its output provided to drive a separate light-emitting diode LED1, LED2, ... LEDn (a suitable buffer amplifier may be used for this purpose) which will be illuminated when a logical "one" output from a corresponding output AND gate drives a particular diode.

Under these conditions, the meter will display an uninterrupted line, segment or column of light starting from the LED next above that which is extinguished by reason of its associated inverter receiving a logical "one" input, and extending through the last LED illuminated in the segment. It will be noted that the length of the illuminated line gives an indication of the crest factor for the audio signal, the crest factor being defined as the ratio of the peak value to the RMS value. Naturally, the number of LEDs illuminated in the line for the same crest factor will vary as the peak and RMS values vary for the circuitry described above if the resistors R1, R2, ... Rn are equal-valued, but if the resistors are related logarithmically, the number of LEDs illuminated will indicate the crest factor, despite variations in the peak and RMS values.

Figure 3:
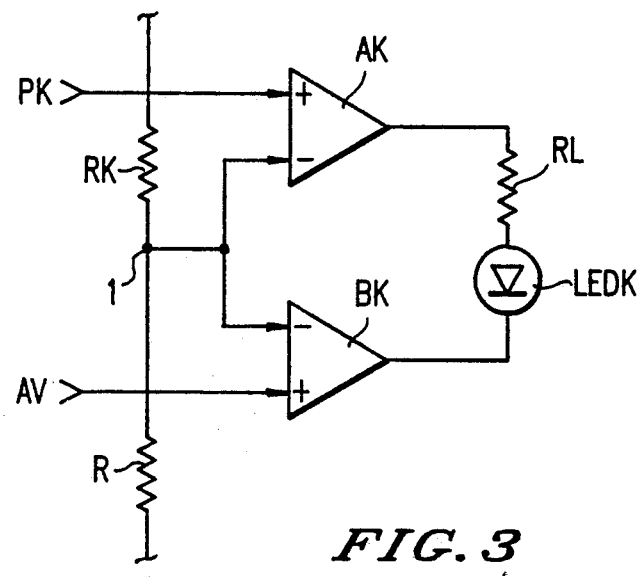
FIG. 3 is a simplified diagram of another embodiment of the invention.

In another embodiment of the invention illustrated in FIG. 3 only one pair of respective peak and average comparators Ak and Bk are shown. Their inputs arranged in a manner similar to FIG. 2. Their outputs are coupled in series with load resistor RL and LEDk. In the arrangement, LEDk is forward biased between comparator Ak and comparator Bk. When the Bk value exceeds the bias voltage Vb at node k and when the latter is greater than the average AV, peak comparator Ak produces a "one" output and the average comparator Bk produces a "zero" thus LEDk is illuminated. If the average AV is greater than the bias Vb then regardless of the peak voltage Bk LEDk is off because the LEDk is no longer forward biased with respect to the peak comparator Ak. The arrangement in FIG. 3 is simple and practical implementation of the arrangement hereinbefore described.

While a preferred embodiment of the invention has been illustrated and described, it will be understood that the invention is not limited thereto but contemplates such modifications and further embodiments as may occur to those skilled in the art.

What is claimed is:

1. A linear display device providing a floating bar graph type of display, which comprises a source of peak voltage values delivering instantaneous peak values of an audio signal and a source of average voltage values delivering average values of the audio signal, a source of fixed value bias voltages corresponding to levels of the audio signal, a plurality of pairs of respective peak and average comparator means, each peak and average comparator means responsively coupled to a corresponding bias voltage, respective ones of the peak and average comparator means connected to the respective sources of peak voltage values and average voltage values for providing an output from said peak and average comparator means when the average voltage value and the instantaneous peak voltage value exceed the corresponding fixed bias voltage value; logic means connected to the outputs of each pair of peak and average comparator means for providing an output only when the instantaneous peak value exceeds the corresponding fixed bias value voltage and the fixed bias voltage value exceeds the corresponding average voltage value, said logic means including a plurality of inverters, one each, individually connected to the output of a corresponding one of the average comparator means and a plurality of AND gates, one each, individually connected to the output of a corresponding one of the peak comparator means and inverter; and light-emitting means connected to the logic means output from each pair of peak and average comparator means for illuminating the display.

2. A linear display device as defined in claim 1 wherein said source of fixed bias value voltages comprises a chain of resistors for establishing a series of said corresponding fixed value voltages which are logarithmically related.

3. A linear display device providing a floating bar graph type of display, which comprises a source of non-linear bias voltages providing a series of bias voltage outputs which are non-linearly related, a pair of comparator means having one of two inputs connected individually to one bias voltage output, one of each pair having an instantaneous peak voltage output connected thereto and the other of each pair having an average voltage output connected thereto, logic means connected to the outputs of each pair of comparator means for providing an output therefrom only when the instantaneous peak voltage exceeds the bias voltage and the bias voltage exceeds the average voltage, and light-emitting means connected to the logic means output from each pair being illuminated in response thereto.

4. A linear display device as defined in claim 3 wherein said logic means comprises a plurality of inverters each individually connected to the output of each average comparator means which is connected to the instantaneous average voltage output.

5. A linear display device as defined in claim 4 wherein said logic means further comprises a plurality of AND gates each individually connected to the output of an inverter and individually to the output of each peak comparator means which is connected to the instantaneous peak voltage output.

6. A linear display device as defined in claim 5 wherein said series of bias voltage outputs are logarithmically related.

7. A linear display device as defined in claim 3 wherein said logic means comprises a series connected light-emitting diode forward biased between the output of each pair of comparator means.

* * * * *